(12) United States Patent
Weng et al.

(10) Patent No.: US 10,510,667 B2
(45) Date of Patent: Dec. 17, 2019

(54) CONDUCTIVE COATING FOR A MICROELECTRONICS PACKAGE

(71) Applicant: Intel Corporation, Santa Clara, CA (US)

(72) Inventors: Li-Sheng Weng, Chandler, AZ (US); Chung-Hao Joseph Chen, Portland, OR (US); Emile Davies-Venn, Gilbert, AZ (US); Kemal Aygun, Chandler, AZ (US); Mitul B. Modi, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 15/386,737

(22) Filed: Dec. 21, 2016

(65) Prior Publication Data
US 2018/0174972 A1    Jun. 21, 2018

(51) Int. Cl.
| | |
|---|---|
| H01L 23/66 | (2006.01) |
| H01L 23/538 | (2006.01) |
| H01L 23/552 | (2006.01) |
| H01L 25/065 | (2006.01) |
| H01L 21/48 | (2006.01) |

(52) U.S. Cl.
CPC ........ *H01L 23/5383* (2013.01); *H01L 23/552* (2013.01); *H01L 25/0655* (2013.01); *H01L 21/4857* (2013.01); *H01L 23/66* (2013.01); *H01L 2223/6677* (2013.01); *H01L 2224/18* (2013.01); *H01L 2924/15192* (2013.01)

(58) Field of Classification Search
CPC ..... H01L 23/66; H01L 23/552; H01L 23/538; H01L 23/5383; H01L 23/5384; H01L 23/5386; H01L 25/0655; H01L 2223/6677; H01L 2224/18; H01L 2924/15192

USPC .......................................................... 257/668
See application file for complete search history.

(56) References Cited

U.S. PATENT DOCUMENTS

| | | | |
|---|---|---|---|
| 7,405,477 B1 | 7/2008 | Tao et al. | |
| 2009/0075428 A1 | 3/2009 | Tang et al. | |
| 2014/0191907 A1* | 7/2014 | Cho | ..................... H01Q 1/2283 |
| | | | 343/700 MS |
| 2015/0070851 A1 | 3/2015 | Kitazaki et al. | |

FOREIGN PATENT DOCUMENTS

| | | |
|---|---|---|
| KR | 1020090026612 | 3/2009 |
| WO | 2018118329 | 6/2018 |

OTHER PUBLICATIONS

"International Application Serial No. PCT US2017 062847, International Search Report dated Mar. 5, 2018", 3 pgs.
"International Application Serial No. PCT US2017 062847, Written Opinion dated Mar. 5, 2018", 10 pgs.

* cited by examiner

*Primary Examiner* — Chuong A Luu
(74) *Attorney, Agent, or Firm* — Schwegman Lundberg & Woessner, P.A.

(57) ABSTRACT

Disclosed is a microelectronics package. The microelectronics package may include a reference plane, a signal routing layer, a dielectric layer, and a conductive layer. The signal routing layer may include a plurality of signal routing traces. The dielectric layer may be located adjacent to the signal routing layer. The conductive layer may be applied to the dielectric layer such that the dielectric layer is located in between the signal routing layer and the conductive layer. The conductive layer may be in electrical communication with the reference plane.

20 Claims, 8 Drawing Sheets

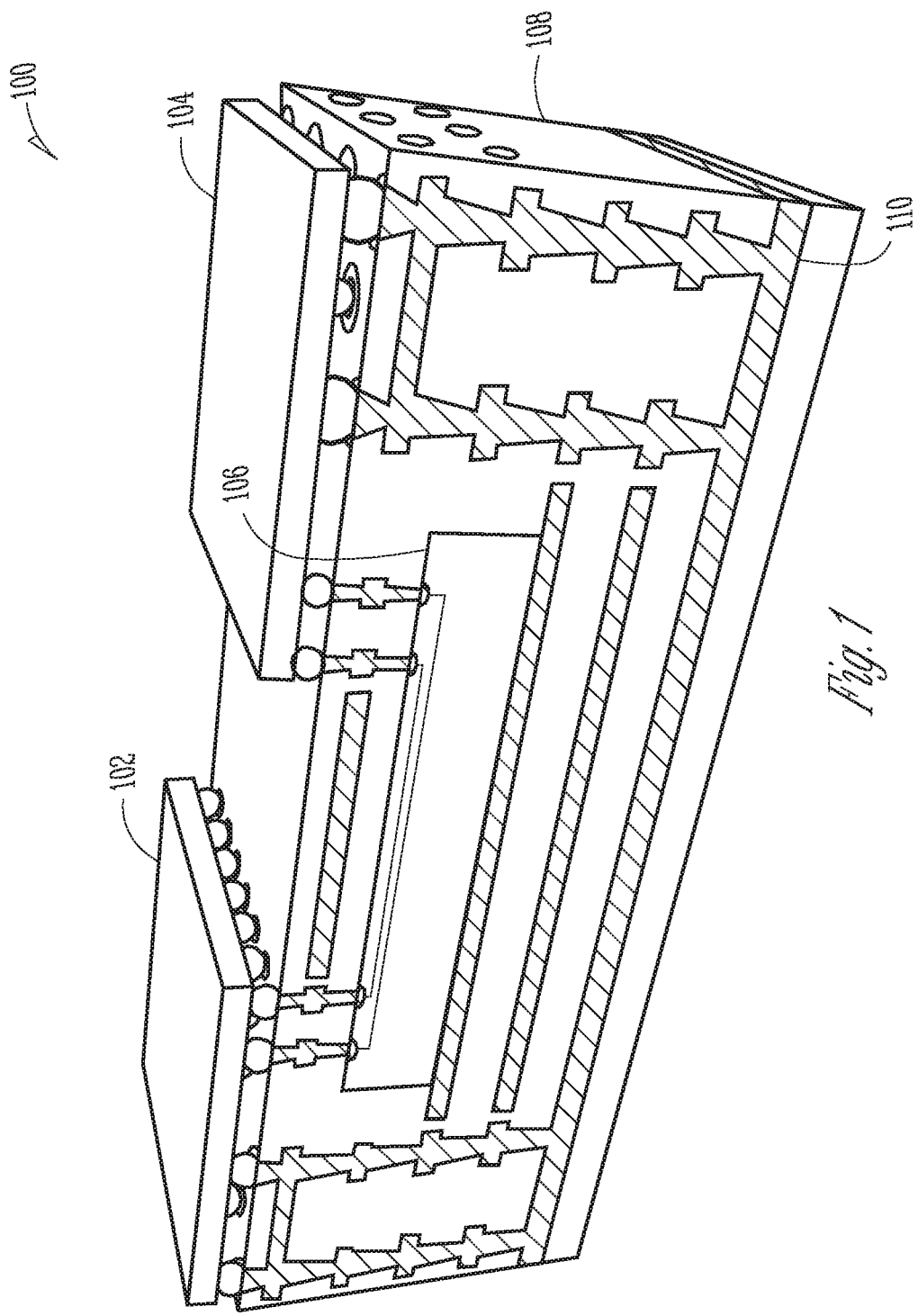

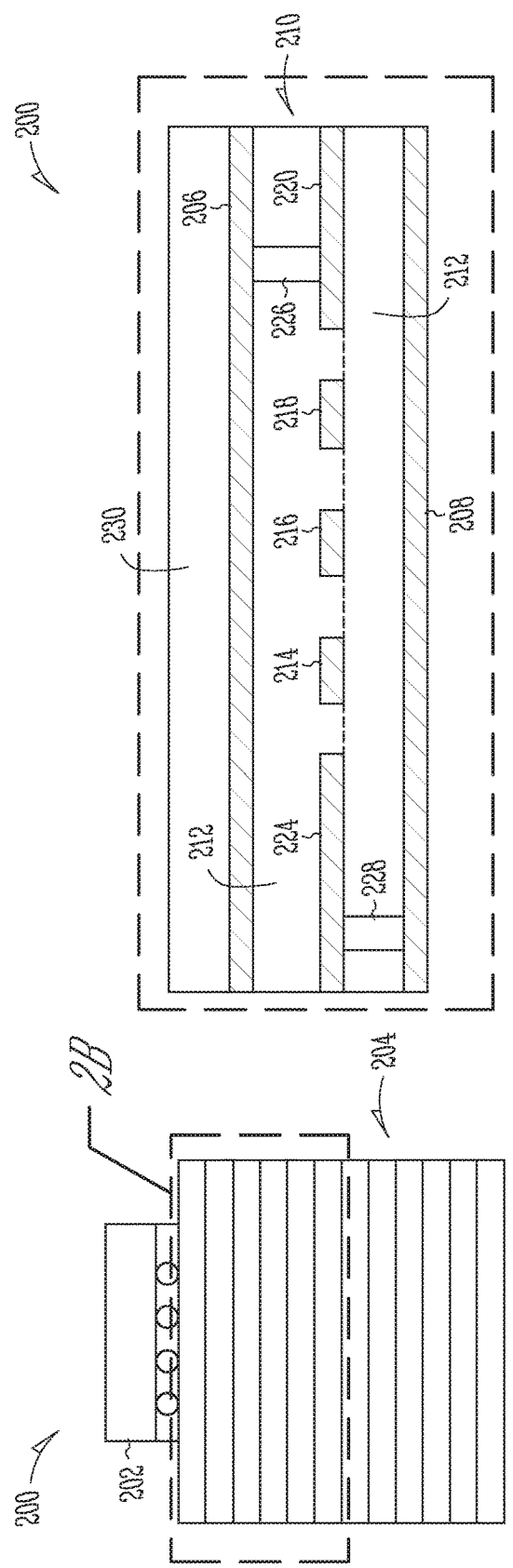

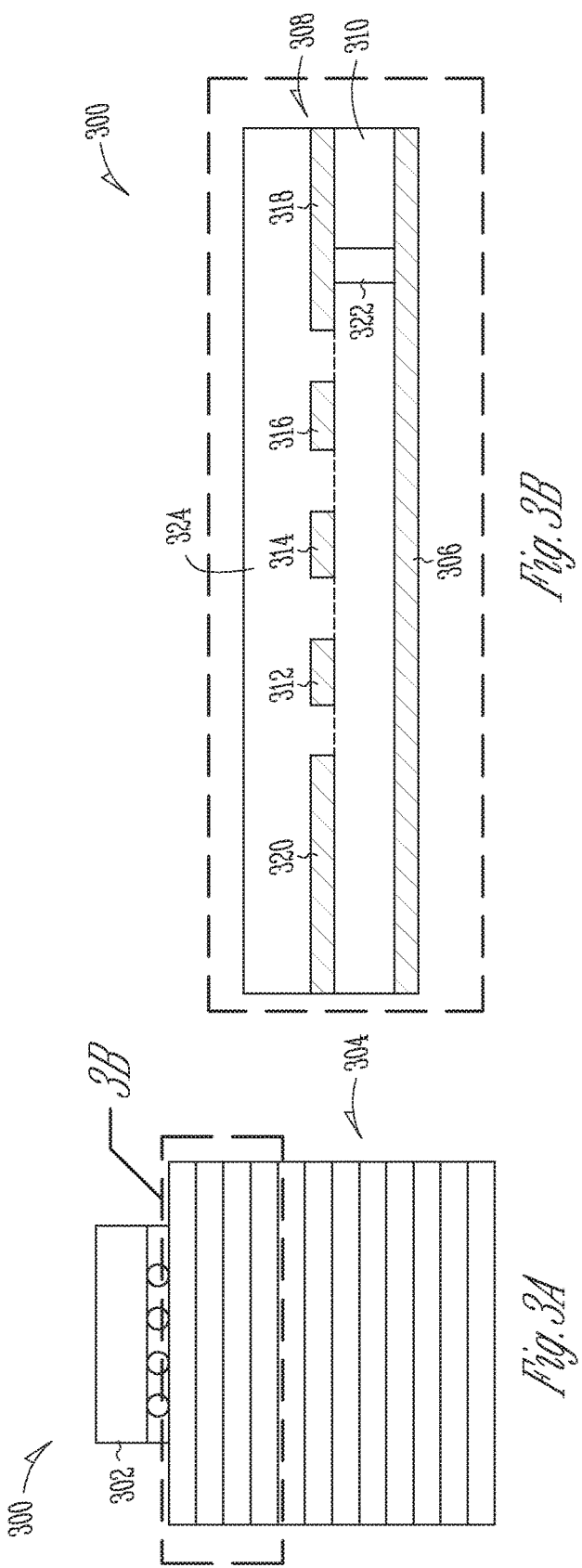

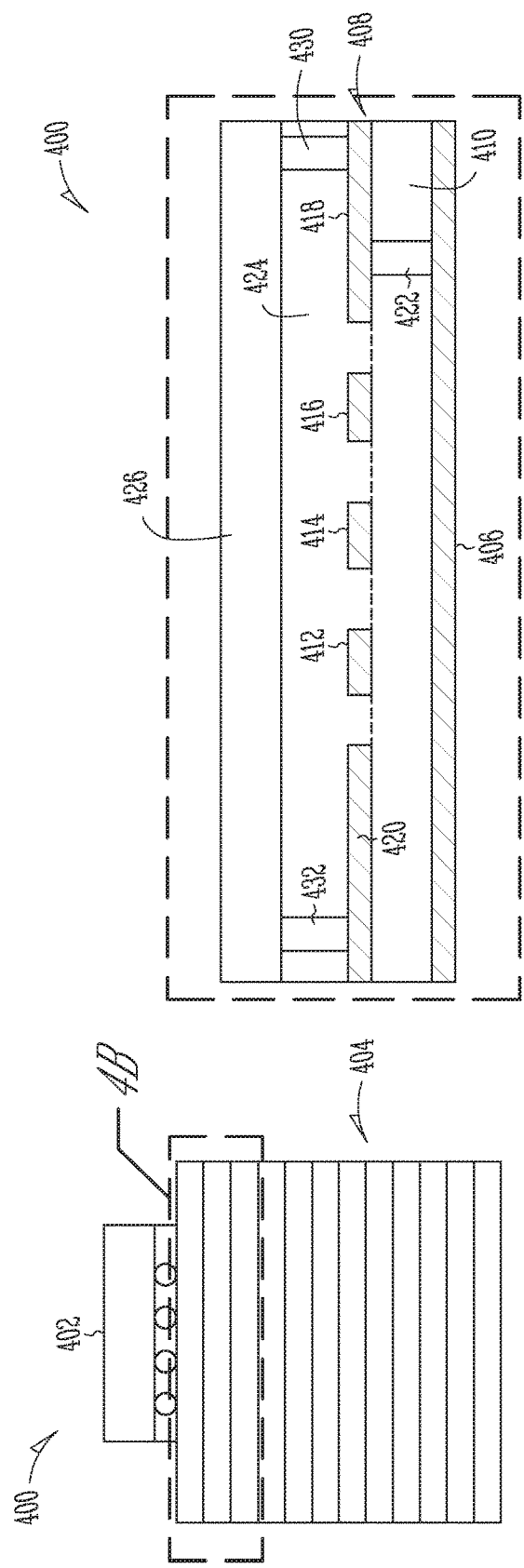

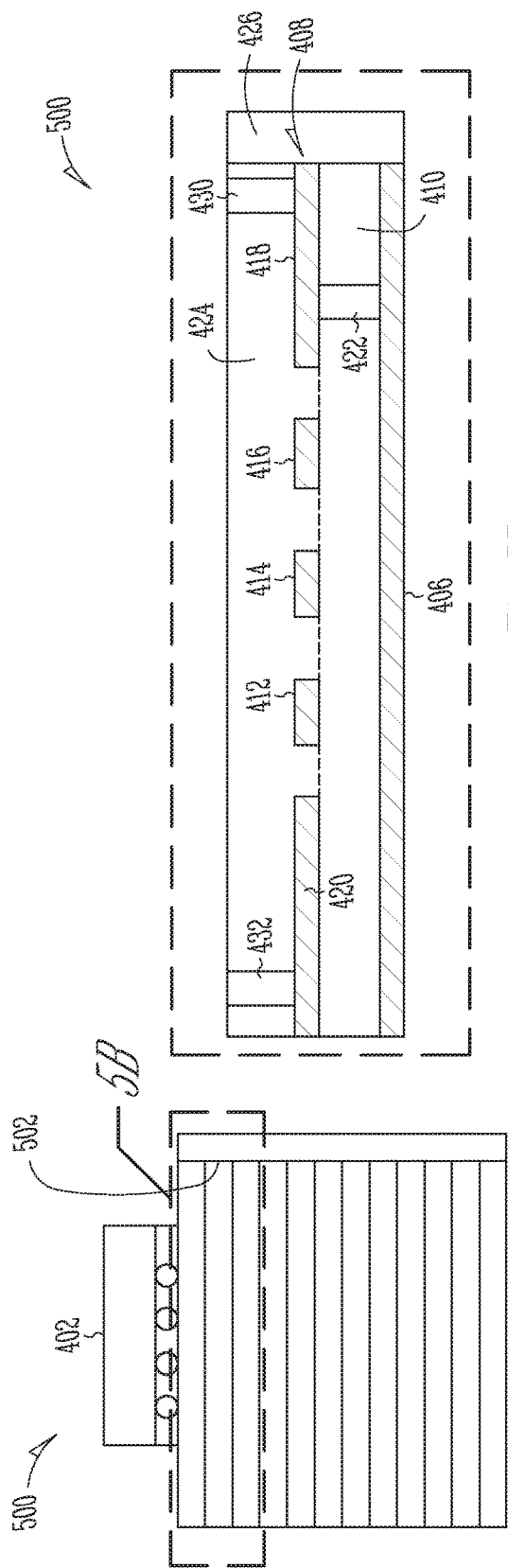
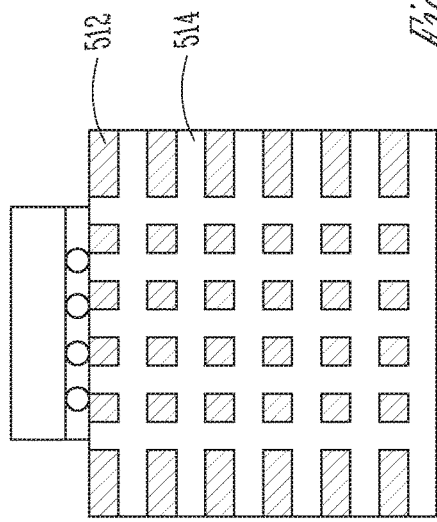
Fig. 5A
Fig. 5B
Fig. 5C

CONDUCTIVE COATING FOR A MICROELECTRONICS PACKAGE

TECHNICAL FIELD

Embodiments described generally herein relate to microelectronics packages. More particularly, embodiments described generally herein relate to conductive coating for microelectronics packages.

BACKGROUND

Microelectronics generally include a central processing unit (CPU). In order to enhance performance, CPU products are increasingly integrating multiple dies within the CPU package in a side-by-side or other multi-chip module (MCM) format. An embedded multi-die interconnect bridge (EMIB) is a way to electrically connect multiple dies within a microelectronics package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 illustrates a portion of a microelectronics package in accordance with some embodiments disclosed herein.

FIGS. 2A and 2B illustrate a stripline routing package in accordance with some embodiments disclosed herein.

FIGS. 3A and 3B illustrate a microstrip routing package in accordance with some embodiments disclosed herein.

FIGS. 4A and 4B illustrate a microstrip routing package in accordance with some embodiments disclosed herein.

FIGS. 5A-5C illustrate a microstrip routing package in accordance with some embodiments disclosed herein.

DETAILED DESCRIPTION

Figure 6:
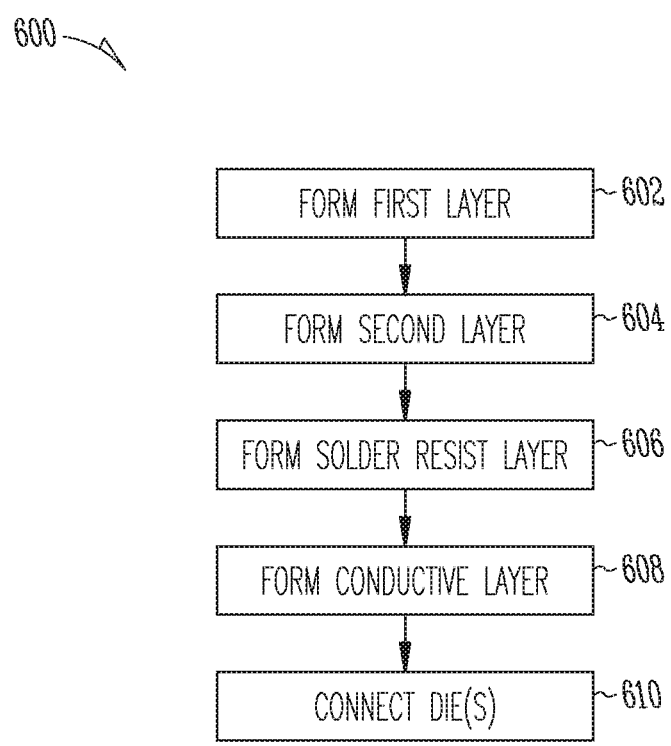
FIG. 6 illustrates a method for manufacturing a microelectronics package in accordance with some embodiments disclosed herein.

Package stripline routing (see FIGS. 2A and 2B), which may have ground referencing planes above and below a signal routing later, may allow for a package design with optimized high-speed signal integrity. When the stripline routing scheme is implemented, package substrate surface layer metal may be utilized as ground referencing and little may be used for signal routing. On the other hand, microstrip routing (see FIGS. 3A and 3B), which may utilize package surface layer for signal routing, may reduce a pair of substrate buildup layers in the design and thus, may reduce the substrate cost. However, microstrip routing may compromise signal integrity.

As disclosed herein, a conductive material may be applied on a top, or other, surface of a package front-side solder resist layer during the manufacturing process. The conductive material may be grounded to a designated and exposed ground area on the surface metal layer. The conductive material may act as a pseudo metal layer on the top of the substrate solder resist layer and enable the microstrip routing to achieve the stripline signal integrity. In addition, the conductive material may achieve substrate cost saving by utilizing microstrip routing package design. The conductive material may be a metallic substance or a polymer.

Turning now to the figures, FIG. 1 illustrates a microelectronics package 100. The microelectronics package 100 may include a first die 102, a second die 104, a package interconnect 106, and substrate 108. As shown in FIG. 1, the microelectronics package 100 may also include electrical connections 110 that may be used to power the first die 102 and the second die 104 and allow signals to pass between the first die 102 and the second die 104. The electrical connections 110 may also be used to provide ground references. The electrical connections 110 may also be used to connect signals from the first die 102 and the second die 104 to components outside of the microelectronics package 100 through pins grid array (PGA), ball grid array (BGA), land grid array (LGA) pads or other second level interconnect form/shape on top, bottom, or other sides of the package. The package interconnect 106 may be surrounded by, or embedded in, the substrate 108.

A silicon bridge may refer to EMIB technology. For example, small pieces of silicon may be embedded in an organic package substrate and provide high-density interconnect between dies on the package. Active dies may be assembled on a large piece of silicon that provides dense interconnect between the dies. As opposed to a silicon bridge, a silicon interposer may have through-silicon vias (TSVs) to provide off-package interconnects.

FIGS. 2A and 2B illustrate a stripline routing package 200 in accordance with some embodiments disclosed herein. The stripline routing package 200 may include a die 202 electrically coupled to a plurality of buildup layers 204. As shown in FIG. 2B, the plurality of buildup layers 204 may include ground (e.g., VSS) reference planes 206 and 208 and signal routing layer 210. The VSS reference planes 206 and 208 may be separated from the signal routing layer 210 by a dielectric material 212. The signal routing layer 210 may include signal routing traces 214, 216, and 218. The signal routing layer 210 may also include VSS reference planes 220 and 224 that may be connected to VSS reference planes 206 and 208 using vias 226 and 228, respectively. A solder resist layer 230 may be located atop the plurality of buildup layers 204. While FIG. 2B only shows a few buildup layers, as shown in FIG. 2A, the plurality of buildup layers 204 may include any number of buildup layers that include VSS reference planes and signal routing layers separated by a dielectric material.

FIGS. 3A and 3B illustrate a microstrip routing package 300 in accordance with some embodiments disclosed herein. The microstrip routing package 300 may include a die 302 electrically coupled to a plurality of buildup layers 304. As shown in FIG. 3B, the plurality of buildup layers 304 may include a VSS reference plane 306 and signal routing layer 308. The VSS reference plane 306 may be separated from the signal routing layer 308 by a dielectric material 310. The signal routing layer 308 may include signal routing traces 312, 314, and 316. The signal routing layer 308 may also include VSS reference planes 318 and 320. As shown, VSS reference plane 306 may be connected to VSS reference plane 318 using via 322. While not shown, VSS reference plane 320 may be connected to VSS reference plane 306 or other VSS reference planes using vias. A solder resist layer 324 may be located atop the plurality of buildup layers 304. While FIG. 3B only shows a few buildup layers, as shown in FIG. 3A, the plurality of buildup layers 304 may include any number of buildup layers that include VSS reference planes and signal routing layers separated by a dielectric material.

FIGS. 4A and 4B illustrate a microstrip routing package 400 in accordance with some embodiments disclosed herein. The microstrip routing package 400 may include a die 402 electrically coupled to a plurality of buildup layers 404. As shown in FIG. 4B, the plurality of buildup layers 404 may include a VSS reference plane 406 and signal routing layer 408. The VSS reference plane 406 may be separated from the signal routing layer 408 by a dielectric material 410. The signal routing layer 408 may include signal routing traces 412, 414, and 416. The signal routing layer 408 may also include VSS reference planes 418 and 420. As shown, VSS reference plane 406 may be connected to VSS reference plane 418 using via 422. A dielectric layer 424 may be located atop the plurality of buildup layers 304. An example of a dielectric layer may include a solder resist layer. While FIG. 4B only shows a few buildup layers, as shown in FIG. 4A, the plurality of buildup layers 404 may include any number of buildup layers that include VSS reference planes and signal routing layers separated by a dielectric material.

The microstrip routing package 400 may include a conductive material 426 applied to the top of the microstrip routing package 400 on the solder resist layer 424. The conductive material 426 may be grounded to a designated and exposed ground areas on a surface metal layer. The conductive material 426 may act as a reference layer on the top of the solder resist layer 424. For example, as shown in FIG. 4B, the conductive material 426 may be connected to the VSS reference planes 418 and 420 by vias 430 and 432, respectively. Thus, the conductive material 426 may enable the microstrip routing package 400 to achieve the stripline equivalent signal integrity while also achieving the substrate cost saving by prevention of the layer count increase. Furthermore, the conductive material 426 also may act as a package-level electromagnetic interference (EMI) shield. By acting as an EMI shield, the conductive material 426 may prevent undesired energy coupling or radio frequency interference (RFI) from the microstrip routing package 400 dual data rate (DDR) data lines or other highs speed lines to nearby radio antennas (e.g., Wi-Fi, etc.) located proximate the microstrip routing package 400.

The conductive material 426 can be applied in a variety of fashions. For example, the conductive material 426 may be sputtered and result the conductive material 426 having a thickness of about 5 microns. In addition, the conductive material 426 may be spray coated and have a thickness of about 5 microns to about 50 microns or applied as an adhesive and have a thickness greater than about 50 microns. Furthermore, the conductive material 426 can be plated and have a thickness of about 10 microns to about 100 microns.

While FIGS. 4A and 4B show the conductive material 426 applied to a top surface of the microstrip routing package 400, as shown in FIG. 5, the conductive material 426 may be applied to a side surface 502. In addition, the conductive material 426 can be applied to other surfaces of the microstrip routing package 500. In addition, by applying the conductive material 426 to one or more surfaces (e.g., top surfaces, side surfaces, bottom surfaces, etc.), the various ground reference planes (e.g., ground reference planes 406, 418, and 420) can be electrically connected without the need for various vias (e.g., vias 422, 430, and 432). The conductive material 426 can be applied as a solid layer as shown in FIGS. 4A and 4B. In addition, the conductive material 426 can be applied over the various layers 512 as a grid 514 as shown in FIG. 5C or other such patterns.

FIG. 6 illustrates a method 600 for manufacturing a microelectronics package in accordance with some embodiments disclosed herein. The method 600 begins at stage 602 where a first layer may be formed. For example, the first layer may be a reference plane, such as a ground reference plane. In addition, the first layer may be a signal routing layer with a plurality of signal routing traces. The forming of the first layer may vary depending on the number of layers to be formed. For example, if the microelectronics package is to have four layers, the first layer may be a reference plane. If the microelectronics package is to have three layers, the first layer may be a signal routing layer.

From stage 602, the method 600 may proceed to stage 604 where a second layer may be formed. The second layer may be the same or different that the first layer. For example, if the first layer is a reference layer, the second layer may be a signal routing layer. From stage 604, the method 600 may proceed to stage 606 wherein a solder resist layer may be formed. The solder resist layer may be formed adjacent to (i.e., on top of) a signal routing layer. The solder resist layer may be formed of an organic compound or other electrical insulator.

From stage 606, the method 600 may proceed to stage 608 where a conductive layer may be formed. The conductive layer may be formed adjacent to (i.e., on top of) the solder resist layer. The conductive layer can be formed by sputtering and spray techniques and have a thickness that ranges from about 5 microns to about 50 microns, or more. As the conductive layer is being formed, the conductive layer can be formed such that the conductive layer provides electromagnetic interference shielding. For example, as disclosed herein, the conductive layer can be formed as a solid layer or in a grid fashion such that the conductive layer provides electromagnetic interference shielding between the various layers that make up the microelectronics package and any antennas that may be located proximate the microelectronics package. Alternatively, the conductive layer can be applied after the die is attached providing shielding for both the die and the substrate.

Furthermore, the conductive layer may be formed from a variety of materials. For example, the conductive layer may be formed using an epoxy doped with a conductive material such that the epoxy layer can conduct electrical signals. For instance, the epoxy may be filled with copper, stainless steel, nickel, titanium, silver, gold, iron, aluminum, cobalt, chromium, molybdenum, palladium, platinum, tantalum, tungsten, or any metallic alloy that would allow for the conduction of electrical signals. In addition, the conductive layer may be applied via a variety of techniques including, but not limited to, sputter coating, electrodepositing, etc.

At stage 608, the conductive layer may be formed on a side of the microelectronics package. For example, and as shown in FIG. 5, the conductive layer may be formed along the edges of the various layers of the microelectronics package. Having the conductive layer along the side of the microelectronics package may allow for greater electromagnetic interference shielding. In addition, having the conductive layer along the side of the microelectronics package may allow the various reference layers to be electrically connected without the use of vias, or with a reduced number of vias.

The conductive layer may also utilize predefined solder resist openings that may allow the conductive layer to be deposited and make contact with vias connected to the reference planes. During the manufacturing process, individual microelectronics packages may need to be reconstituted to a carrier, which could be a ring frame or metal carrier. This frame or carrier may be prepared with a tape that either has a thick adhesive for second level interconnects to be embedded into or cut-outs for the second level interconnect joints. The tape may also prevent the second level interconnect joints from being coated with the deposited conductive material since the deposited material may coat all exposed surfaces including the top and sides of the package.

In addition, individual microelectronics packages may be processed directly on a tray or strip without being reconstituted on a carrier. For example, if the conductive coating is applied to only a top surface of the microelectronics packages, the various units may not need to be reconstituted to a carrier to have the conductive coating applied.

Individual units may be picked and placed onto the frame or carrier and this media may be ran through a sputter or spray tool. Upon completion, the microelectronics packages may be removed and inspected to ensure no defects in the top and side coating and that there is no coating on the second level interconnect joints. Prior to processing the units through a sputter or spray tool, the die area or other parts of the substrate may be masked to protect the die area or other areas of the substrate from being coated.

From stage 608, the method may proceed to stage 610 where one or more dies may be connected to the microelectronics package. For example, the various layers may be usage as an interconnect bridge between to dies. As a result, the two dies can be connected to the interconnect bridge to form the microelectronics package.

Figure 7:
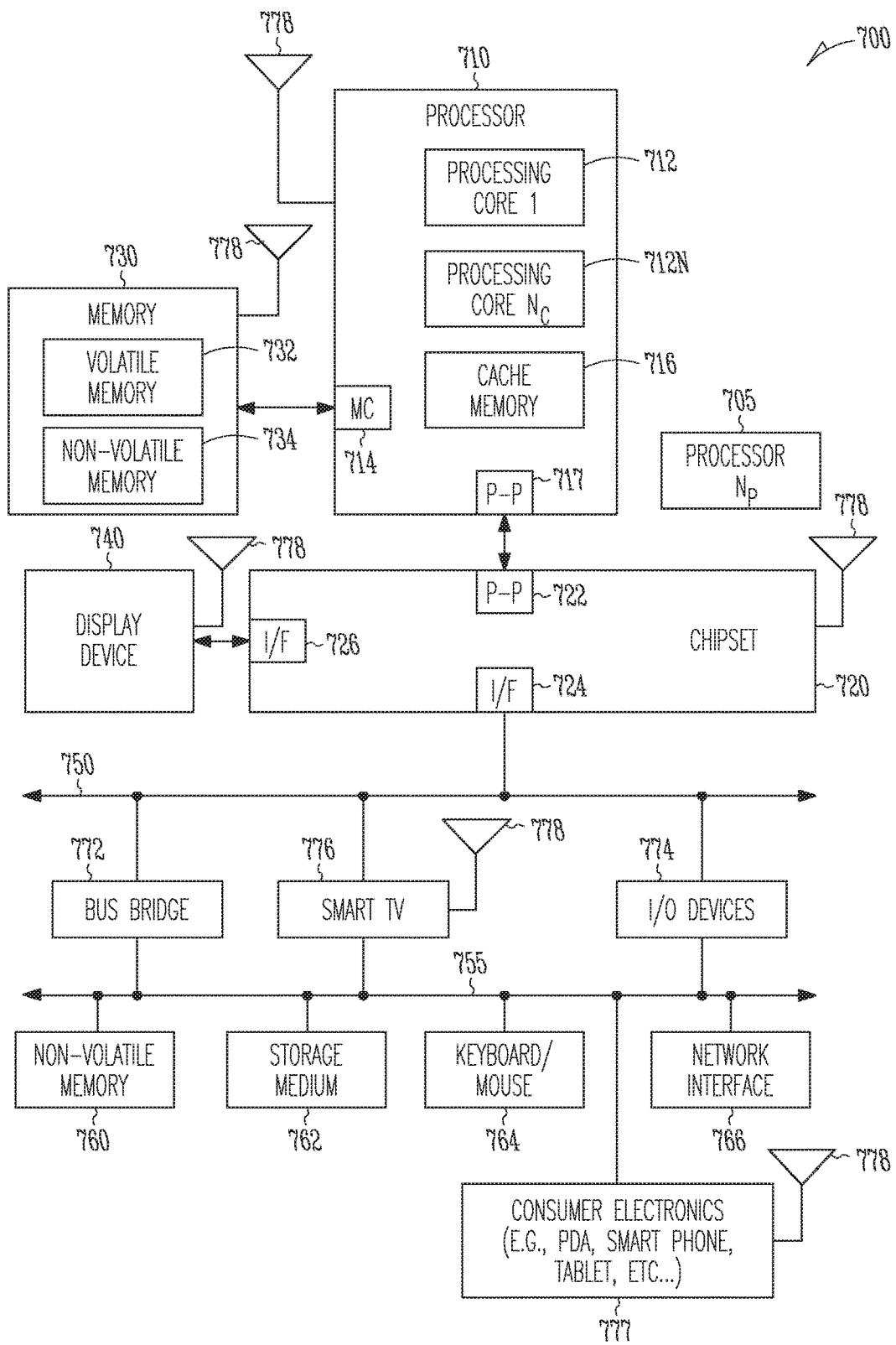
FIG. 7 illustrates a system level diagram in accordance with some embodiments disclosed herein.

FIG. 7 illustrates a system level diagram, according to one embodiment. For instance, FIG. 7 depicts an example of an electronic device (e.g., system) including the microelectronics package 100 or the signaling system as described herein with reference to FIGS. 1-5B. FIG. 7 is included to show an example of a higher level device application. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N$_c$, where 712N$_c$ represents the Nth processor core inside processor 710 where N$_c$ is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions, and the like. In some embodiments, processor 710 has a cache memory 716 to cache instructions and/or data for system 700. Cache memory 716 may be organized into a hierarchical structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to an antenna 778 to communicate with any device configured to transmit and/or receive wireless signals. In one embodiment, the antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), Rambus Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705, display device 740, and other devices 772, 776, 774, 760, 762, 764, 766, 777, etc. Chipset 720 may also be coupled to an antenna 778 to communicate with any device configured to transmit and/or receive wireless signals.

Chipset 720 connects to display device 740 via interface (I/F) 726. Display 740 may be, for example, a liquid crystal display (LCD), a plasma display, cathode ray tube (CRT) display, or any other form of visual display device. In some embodiments, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, a network interface 766, smart TV 776, consumer electronics 777, etc., via interface 724.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) may be incorporated into processor core 712.

Figure 8:
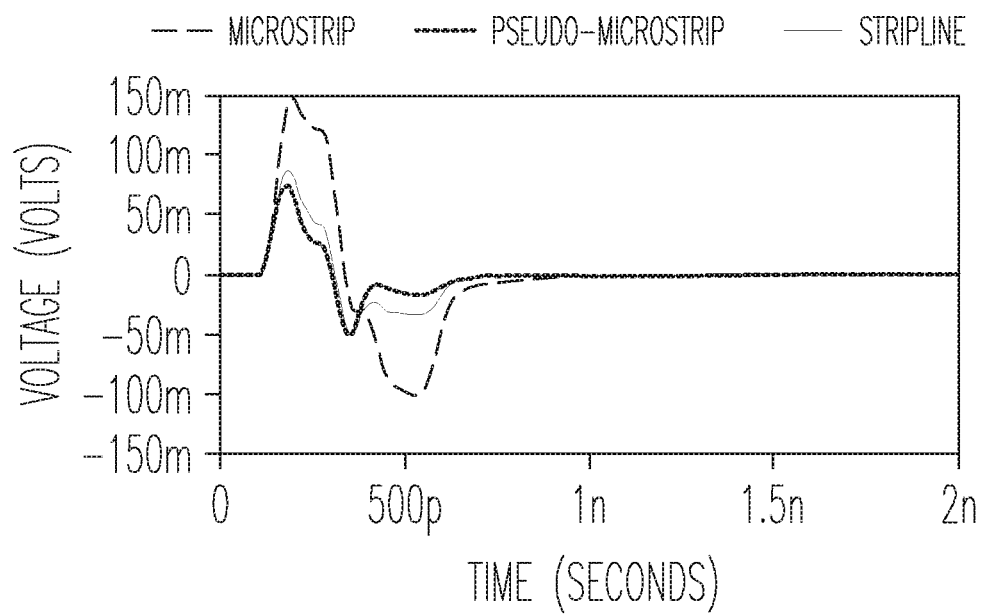
FIGS. 8 and 9 illustrate crosstalk data in accordance with some embodiments disclosed herein.
Figure 9:
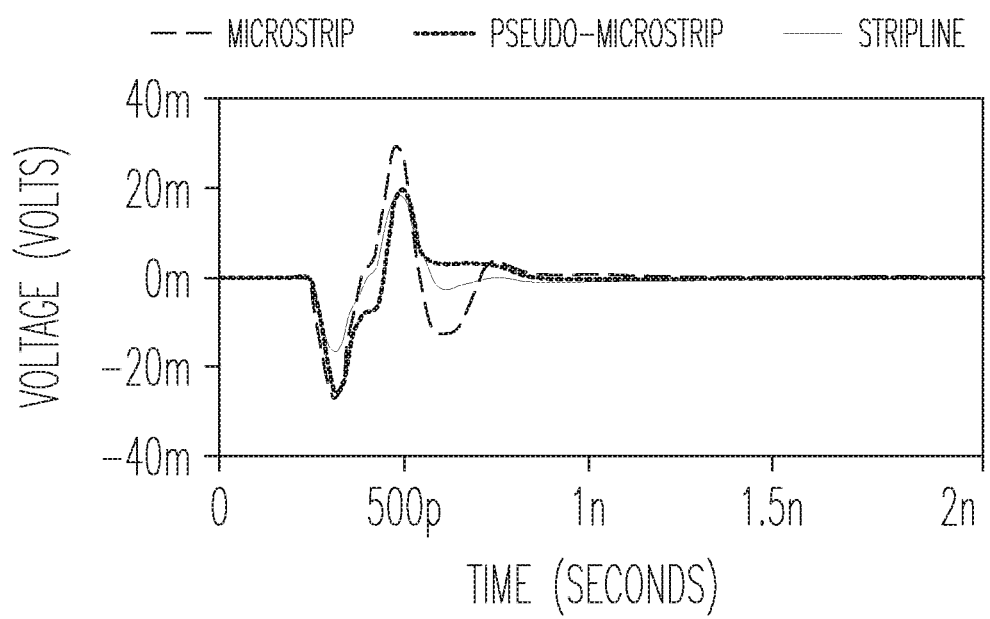

FIGS. 8 and 9 illustrate near-end crosstalk (NeXT) and far-end crosstalk (FeXT) simulation data in accordance with some embodiments disclosed herein. As shown in FIGS. 8 and 9, the pseudo-microstrip systems and methods disclosed herein show comparable or significantly better performance than traditional microstrip and stripline systems.

In addition, to improved crosstalk performance, the pseudo-microstrip systems and methods disclosed herein show improved radio frequency interference (RFI) performance as well. For example, simulations using the complete package form factors disclosed herein and representative DDR data line have been performed. RFI levels two inches away from the microelectronics package were recorded as DDR lines were randomly switching. Table I below show the results of the simulations. As shown in Table I, the pseudo-microstrip systems disclosed herein show significant improvement over traditional microstrip packages for two Wi-Fi bands.

TABLE I

| RFI Simulation Results | | |
| --- | --- | --- |
| Frequency Band | Exposed Microstrip | Fully Covered Sputter Grounded Microstrip |
| 2.45 GHz | −67.97 dB | −109.66 dB |
| 5.5 GHz | −70.75 dB | −93.45 dB |

Additional Notes & Examples

Example 1 includes a microelectronics package comprising: a reference plane; a signal routing layer including a plurality of signal routing traces; a dielectric layer located adjacent to the signal routing layer; and a conductive layer applied to the dielectric layer such that the dielectric layer is located in between the signal routing layer and the conductive layer, the conductive layer in electrical communication with the reference plane.

In Example 2, the microelectronics package of Example 1 may optionally include a dielectric layer located adjacent the signal routing layer opposite the dielectric layer such that the dielectric layer is located in between the signal routing layer and the reference plane.

In Example 3, the microelectronics package of any one of Examples 1 and 2 may optionally include the conductive layer having a thickness of about 5 microns.

In Example 4, the microelectronics package of any one of Examples 1 and 2 may optionally include the conductive layer having a thickness of about 5 microns to about 50 microns.

In Example 5, the microelectronics package of any one of Examples 1 and 2 may optionally include the conductive layer having a thickness greater than 50 microns.

In Example 6, the microelectronics package of any one of Examples 1-5 may optionally include at least one die located adjacent to and in electrical communication with the conductive layer.

In Example 7, the microelectronics package of any one of Examples 1-6 may optionally include the conductive layer being configured to provide electromagnetic interference shielding between the plurality of signal routing traces and a radio antenna located proximate the microelectronics package.

In Example 8, the microelectronics package of any one of Examples 1-6 may optionally include the conductive layer including a grid of conductive material.

In Example 9, the microelectronics package of any one of Examples 1-6 may optionally include the conductive layer including an epoxy doped with a conductive material.

In Example 10, the microelectronics package of Example 8 or 9 may optionally include the conductive material being selected from the group consisting of a polymer, copper, stainless steel, nickel, titanium, or any alloy thereof.

Example 11 includes a method of manufacturing microelectronics package. The method comprising: forming a reference plane; forming a routing layer, the routing layer including a plurality of signal routing traces; forming a dielectric layer adjacent to the signal routing layer; and forming a conductive layer adjacent the dielectric layer such that the dielectric layer is located in between the signal routing layer and the conductive layer, the conductive layer in electrical communication with the reference plane.

In Example 12, the method of Example 11 may optionally include forming a dielectric layer adjacent the signal routing layer opposite the dielectric layer such that the dielectric layer is located in between the signal routing layer and the reference plane.

In Example 13, the method of any one of Examples 11 and 12 wherein forming the conductive layer may optionally include forming the conductive layer to a thickness of about 5 microns.

In Example 14, the method of any one of Examples 11 and 12 wherein forming the conductive layer may optionally include forming the conductive layer to a thickness of about 5 microns to about 50 microns.

In Example 15, the method of any one of Examples 11 and 12 wherein forming the conductive layer may optionally include forming the conductive layer to a thickness greater than 50 microns.

In Example 16, the method of any one of Examples 11-15 may optionally include electrically connecting at least one die to the signal routing layer, the at least one die located adjacent to and in electrical communication with the conductive layer.

In Example 17, the method of any one of Examples 11-16 may optionally include configuring the conductive layer to provide electromagnetic interference shielding between the plurality of signal routing traces and a radio antenna located proximate the microelectronics package.

In Example 18, the method of any one of Examples 11-17 wherein forming the conductive layer may optionally include forming a grid of conductive material.

In Example 19, the method of any one of Examples 11-17 wherein forming the conductive layer may optionally include forming an epoxy filled with a conductive material.

In Example 20, the method of Examples 18 or 19 may optionally include the conductive material being selected from the group consisting of a polymer, copper, stainless steel, nickel, titanium, silver, gold, iron, aluminum, cobalt, chromium, molybdenum, palladium, platinum, tantalum, tungsten, or any alloy thereof.

Example 21 includes a microelectronics package comprising: a reference plane; a signal routing layer including a plurality of signal routing traces; a dielectric layer located adjacent to the signal routing layer; and a conductive layer applied to surface formed by an edge of each of the reference plane, the signal routing layer, and the dielectric layer, the conductive layer in electrical communication with the reference plane.

In Example 22, the microelectronics package of Example 21 may optionally include a dielectric layer located adjacent the signal routing layer opposite the dielectric layer such that the dielectric layer is located in between the signal routing layer and the reference plane, the conductive layer extending to an edge of the dielectric layer.

In Example 23, the microelectronics package of any one of Examples 21 and 22 may optionally include the conductive layer having a thickness of about 5 microns.

In Example 24, the microelectronics package of any one of Examples 21 and 22 may optionally include the conductive layer having a thickness of about 5 microns to about 50 microns.

In Example 25, the microelectronics package of any one of Examples 21 and 22 may optionally include the conductive layer having a thickness greater than 50 microns.

In Example 26, the microelectronics package of any one of Examples 21-25 may optionally include at least one die located adjacent photo resist layer and in electrical communication with the conductive layer.

In Example 27, the microelectronics package of any one of Examples 21-26 may optionally include the conductive layer being configured to provide electromagnetic interference shielding between the plurality of signal routing traces and a radio antenna located proximate the microelectronics package.

In Example 28, the microelectronics package of any one of Examples 21-26 may optionally include the conductive layer including a grid of conductive material.

In Example 29, the microelectronics package of any one of Examples 21-26 may optionally include the conductive layer including an epoxy filled with a conductive material.

In Example 30, the microelectronics package of Example 28 or 29 may optionally include the conductive material being selected from the group consisting of a polymer, copper, stainless steel, nickel, titanium, silver, gold, iron, aluminum, cobalt, chromium, molybdenum, palladium, platinum, tantalum, tungsten, or any alloy thereof.

Example 31 includes a method of manufacturing microelectronics package. The method comprising: forming a reference plane; forming a routing layer, the routing layer including a plurality of signal routing traces; forming a dielectric layer adjacent to the signal routing layer; and forming a conductive layer along an edge of each of the reference plane, the routing layer, and the dielectric layer, the conductive layer in electrical communication with the reference plane.

In Example 32, the method of Example 31 may optionally include forming a dielectric layer adjacent the signal routing layer opposite the dielectric layer such that the dielectric layer is located in between the signal routing layer and the reference plane.

In Example 33, the method of any one of Examples 31 and 32 wherein forming the conductive layer may optionally include forming the conductive layer to a thickness of about 5 microns.

In Example 34, the method of any one of Examples 31 and 32 wherein forming the conductive layer may optionally include forming the conductive layer to a thickness of about 5 microns to about 50 microns.

In Example 35, the method of any one of Examples 31 and 32 wherein forming the conductive layer may optionally include forming the conductive layer to a thickness greater than 50 microns.

In Example 36, the method of any one of Examples 31-35 may optionally include electrically connecting at least one die to the signal routing layer, the at least one die proximate and in electrical communication with the conductive layer.

In Example 37, the method of any one of Examples 31-36 may optionally include configuring the conductive layer to provide electromagnetic interference shielding between the plurality of signal routing traces and a radio antenna located proximate the microelectronics package.

In Example 38, the method of any one of Examples 31-37 wherein forming the conductive layer may optionally include forming a grid of conductive material.

In Example 39, the method of any one of Examples 31-37 wherein forming the conductive layer may optionally include forming an epoxy filled with a conductive material.

In Example 40, the method of Examples 38 or 39 may optionally include the conductive material being selected from the group consisting of a polymer, copper, stainless steel, nickel, titanium, silver, gold, iron, aluminum, cobalt, chromium, molybdenum, palladium, platinum, tantalum, tungsten, or any alloy thereof.

Example 41 includes a microelectronics package comprising: means for processing a first signal; means for routing the first signal within the microelectronics package; and means for conducting a reference signal, the conducing means applied to the dielectric layer such that the dielectric layer is located in between the signaling means and the conducting means.

In Example 42, the microelectronics package of Example 41 may optionally include the conducting means having a thickness of about 5 microns.

In Example 43, the microelectronics package of Example 41 may optionally include the conducting means having a thickness of about 5 microns to about 50 microns.

In Example 44, the microelectronics package of Example 41 may optionally include the conducting means having a thickness greater than 50 microns.

In Example 45, the microelectronics package of any one of Examples 41-44 may optionally include the conducting means being configured to provide electromagnetic interference shielding between the routing means and a radio antenna located proximate the microelectronics package.

In Example 46, the microelectronics package of any one of Examples 41-45 may optionally include the conducting means including a grid of conductive material.

In Example 47, the microelectronics package of any one of Examples 41-45 may optionally include the conducting means including an epoxy filled with a conductive material.

In Example 48, the microelectronics package of Example 46 or 47 may optionally include the conductive material being selected from the group consisting of a polymer, copper, stainless steel, nickel, titanium, silver, gold, iron, aluminum, cobalt, chromium, molybdenum, palladium, platinum, tantalum, tungsten, or any alloy thereof.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A microelectronics package comprising:
a first reference plane and a second reference plane;
a signal routing layer located in between the first and second reference planes, the signal routing layer including a plurality of signal routing traces;
a first dielectric layer located adjacent to the signal routing layer and the first and second reference planes; and
a conductive layer applied to a side surface of the first dielectric layer such that the conductive layer spans the side surface of the first dielectric layer and electrically couples the first and second reference planes.

2. The microelectronics package of claim 1, further comprising a second dielectric layer located adjacent the signal routing layer opposite the first dielectric layer such that the second dielectric layer is located in between the signal routing layer and the first reference plane.

3. The microelectronics package of claim 1; wherein the conductive layer has a thickness of about 5 microns.

4. The microelectronics package of claim 1, wherein the conductive layer has a thickness of about 5 microns to about 50 microns.

5. The microelectronics package of claim 1, wherein the conductive layer has a thickness greater than 50 microns.

6. The microelectronics package of claim 1, further comprising at least one die located adjacent to and in electrical communication with the conductive layer.

7. The microelectronics package of claim 1, wherein the conductive layer is configured to provide electromagnetic interference shielding between the plurality of signal routing traces and a radio antenna located proximate the microelectronics package.

8. The microelectronics package of claim 1, wherein the conductive layer includes a grid of conductive material.

9. The microelectronics package of claim 1, wherein the conductive layer includes an epoxy filled with a conductive material.

10. The microelectronics package of claim 9, wherein the conductive material is selected from the group consisting of a polymer, copper, stainless steel, nickel, titanium, silver, gold, iron, aluminum, cobalt, chromium, molybdenum, palladium, platinum, tantalum, tungsten, or any alloy thereof.

11. A microelectronics package comprising:
a reference plane;
a signal routing layer including a plurality of signal routing traces;
a first dielectric layer located adjacent to the signal routing layer; and
a conductive layer applied to a vertical surface formed by an edge of each of the reference plane, the signal routing layer, and the first dielectric layer, the conductive layer in electrical communication with the reference plane.

12. The microelectronics package of claim 11, further comprising a second dielectric layer located adjacent the signal routing layer opposite the first dielectric layer such that the second dielectric layer is located in between the signal routing layer and the reference plane, the conductive layer extending to an edge of the second dielectric layer.

13. The microelectronics package of claim 11, wherein the conductive layer is configured to provide electromagnetic interference shielding between the plurality of signal routing traces and a radio antenna located proximate the microelectronics package.

14. The microelectronics package of claim 11, wherein the conductive layer includes an epoxy filled with a conductive material.

15. The microelectronics package of claim 14, wherein the conductive material is selected from the group consisting of a polymer, copper, stainless steel, nickel, titanium, silver, gold, iron, aluminum, cobalt, chromium, molybdenum, palladium, platinum, tantalum, tungsten, or any alloy thereof.

16. The microelectronics package of claim 11, wherein the conductive layer has a thickness of about 5 microns.

17. The microelectronics package of claim 11, wherein the conductive layer has a thickness of about 5 microns to about 50 microns.

18. The microelectronics package of claim 11, wherein the conductive layer has a thickness greater than 50 microns.

19. The microelectronics package of claim 11, further comprising at least one die located adjacent to and in electrical communication with the conductive layer.

20. The microelectronics package of claim 11, wherein the conductive layer includes a grid of conductive material.

* * * * *

UNITED STATES PATENT AND TRADEMARK OFFICE
CERTIFICATE OF CORRECTION

PATENT NO. : 10,510,667 B2
APPLICATION NO. : 15/386737
DATED : December 17, 2019
INVENTOR(S) : Weng et al.

Page 1 of 1

It is certified that error appears in the above-identified patent and that said Letters Patent is hereby corrected as shown below:

In the Claims

In Column 11, Line 59, in Claim 3, delete "claim 1;" and insert --claim 1,-- therefor Signed and Sealed this
Eighteenth Day of August, 2020

Andrei Iancu
*Director of the United States Patent and Trademark Office*